United States Patent [19]

Imai et al.

[11] Patent Number: 4,849,653

[45] Date of Patent: Jul. 18, 1989

[54] SEMICONDUCTOR CIRCUIT DEVICE FOR PREVENTING AN OUTPUT OF A BISTABLE CIRCUIT FROM BECOMING UNSTABLE

[75] Inventors: Kimimasa Imai, Kawasaki; Hiroshi Shinya, Yokohama, both of Japan

[73] Assignee: Kabushiki Kaisha Toshiba, Kawasaki, Japan

[21] Appl. No.: 165,706

[22] Filed: Mar. 8, 1988

[30] Foreign Application Priority Data

Mar. 26, 1987 [JP] Japan .................. 62-72103

[51] Int. Cl.⁴ .................. H03K 3/29; H03K 3/26; H03K 3/284; H03K 17/687
[52] U.S. Cl. .................. 307/290; 307/279; 307/272.1; 307/585
[58] Field of Search ............ 307/290, 291, 279, 272.1, 307/272.2, 443, 354, 362, 363, 480, 481, 585, 276, 268; 328/204, 206

[56] References Cited

U.S. PATENT DOCUMENTS 3,953,744 4/1976 Kawagoe .................. 307/268

FOREIGN PATENT DOCUMENTS 0079726 5/1982 Japan .................. 328/206

OTHER PUBLICATIONS

Osborn, "Schmitt Trigger Prevents Clock Train Overlap", Electronics, Jul. 3, 1972, vol. 45, No. 14.
Neil R. Stewart, "Hysteresis Memory Arrangement", RCA TN No. 686, Jan. 1967.
Reese et al., "A 4K×8 Dynamic RAM with Self-Refresh," IEEE Journal of Solid-State Circuits, vol. SC-16, No. 5, pp. 479-487, Oct. 1981.
Kung et al., "An 8K×8 Dynamic RAM with Self-Refresh," IEEE Journal of Solid-State Circuits, vol. SC-17, No. 5, pp. 863-871, Oct. 1982.

Primary Examiner—Stanley D. Miller
Assistant Examiner—Trong Quang Phan
Attorney, Agent, or Firm—Finnegan, Henderson, Farabow, Garrett & Dunner

[57] ABSTRACT

There is an R-S flip-flop circuit having a threshold voltage of a first value. An input terminal of a Schmitt trigger circuit having a second threshold voltage of a lower value than the first value and a third threshold voltage of a higher value than the first value is connected to an output terminal of the R-S flip-flop circuit.

5 Claims, 4 Drawing Sheets

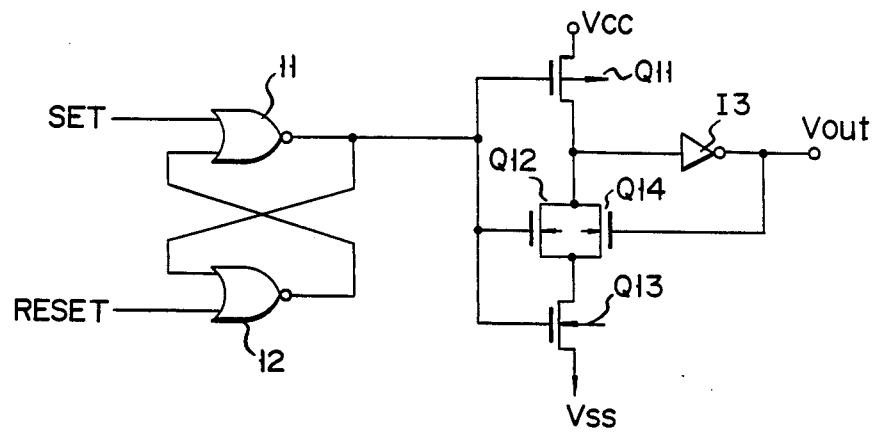
F I G. 6
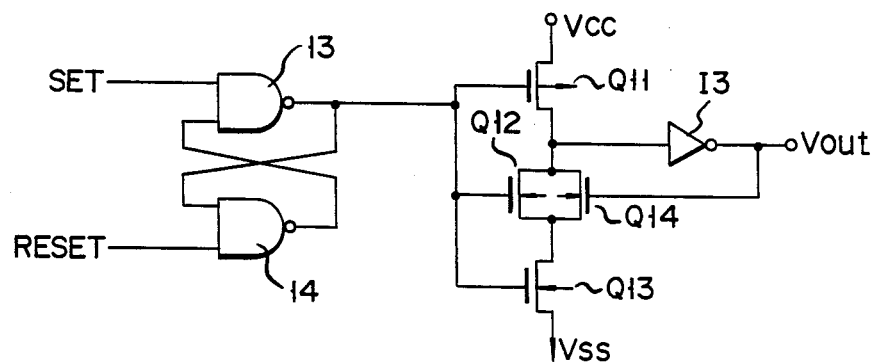
F I G. 7
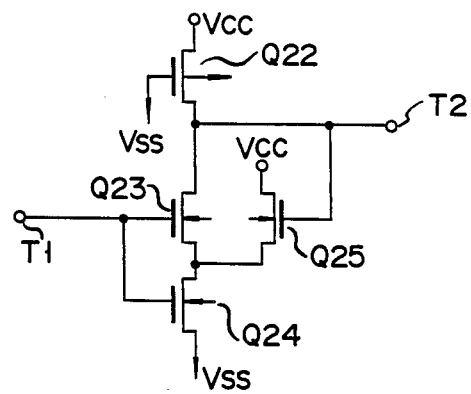
F I G. 8

4,849,653

SEMICONDUCTOR CIRCUIT DEVICE FOR PREVENTING AN OUTPUT OF A BISTABLE CIRCUIT FROM BECOMING UNSTABLE

BACKGROUND OF THE INVENTION

The present invention relates to a semiconductor circuit device and, more particularly, to a semiconductor circuit device which can prevent an output of a bistable circuit from becoming unstable.

A bistable circuit has two output stable states. FIG. 1 shows an example of such a bistable circuit. This bistable circuit is an R-S flip-flop circuit comprising: a latch section consisting of two inverters I1 and I2; and N type MOS transistors Q1 and Q2 in which a set signal and a reset signal are supplied to each gate.

FIG. 2 shows the operation characteristics of this flip-flop circuit. In this diagram, curve L1 indicates input and output characteristics of inverter I1 in the case where a $\overline{Q}$ output terminal is regarded as an input and a Q output terminal is regarded as an output. Curve L2 represents input and output characteristics of inverter I2 in the case where the $\overline{Q}$ output terminal is regarded as an input and the Q output terminal is regarded as an output. Each of cross points A, B, and C of curves L1 and L2 is a stable point of this flip-flop. At cross point A, the $\overline{Q}$ output terminal is set to the logic "0" level and the Q output terminal is set to the "1" level. At cross point C, the $\overline{Q}$ output terminal is set to the logic "1" level and the Q output terminal is set to the "0" level. At cross point B, both of the Q and $\overline{Q}$ output terminals are in a logically unstable state, i.e., they are set to the intermediate potential between the logics "0" and "1". This potential is almost equal to a threshold voltage value of the circuit.

Therefore, when the reset signal is at the "0" level, and the set signal of the "1" level as shown in FIG. 3A is supplied to a gate of transistor Q1, the potential of the Q output terminal is set to the "1" level as shown in FIG. 3B. However, if the potential of a level lower than the "1" level as shown in, e.g., FIG. 3C or 3E was supplied to the gate of transistor Q1 due to the influence of noise and the like, the potential of the Q output terminal may be set to a logically unstable state as shown in FIG. 3D or 3F.

If the potential of the Q output terminal became logically unstable due to the influence of noise and the like, an unexpected fluctuation in the circuit, which is provided at the next stage would occur. Causing the circuit to malfunction.

SUMMARY OF THE INVENTION

It is an object of the present invention to provide a semiconductor circuit device in which an output of a bistable circuit is prevented from becoming unstable due to the influence of noise and the like and the reliability of the operation is high.

According to the invention, there is provided a semiconductor circuit device comprising: a bistable circuit having a threshold voltage of a first value; and a Schmitt trigger circuit which has a second threshold voltage of a lower value than the first value and a third threshold voltage of a higher value than the first value and outputs a voltage corresponding to an output voltage from the bistable circuit.

According to the semiconductor circuit device of the invention, if the output of the bistable circuit becomes logically unstable due to the influence of noise and the like, the output of the Schmitt trigger circuit is held at the preceding output level, whereas it is not fixed to the output potential of the bistable circuit, such that a highly reliable output can be derived.

BRIEF DESCRIPTION OF THE DRAWINGS

FIGS. 6 and 7 are circuit diagrams showing a semiconductor circuit device according to other embodiments of the invention, respectively; and FIG. 8 is a circuit diagram showing another example of a Schmitt trigger circuit which is provided in the semiconductor circuit device of the invention.

DETAILED DESCRIPTION OF THE PREFERRED EMBODIMENTS

Figure 4:
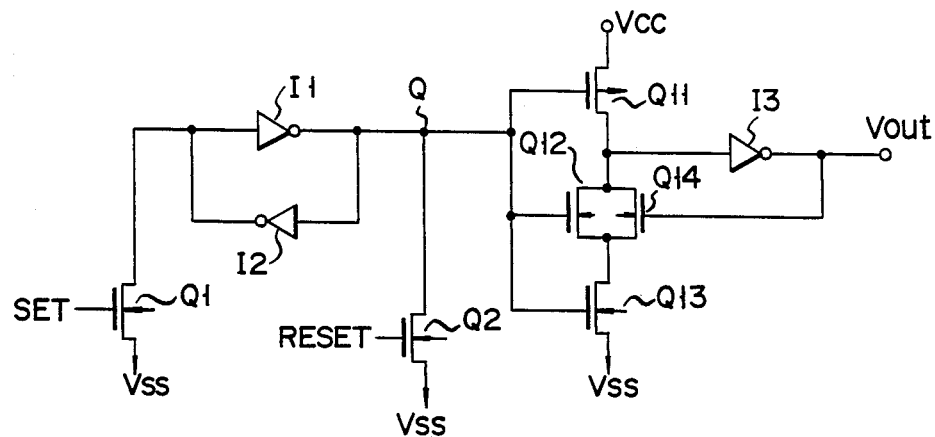
FIG. 4 is a circuit diagram for explaining the first embodiment of a semiconductor circuit device according to the present invention.

FIG. 4 shows a semiconductor circuit device according to an embodiment of the present invention. This circuit constitutes an R-S flip-flop circuit comprising: a latch section consisting of inverters I1 and I2; and N type MOS transistors Q1 and Q2 to set or reset the latch section. An input terminal of a Schmitt trigger circuit is connected to a Q output terminal of this flip-flop circuit. Output voltage $V_{out}$ from the Schmitt trigger circuit is used as an output signal of the semiconductor circuit device.

The threshold voltage of the flip-flop circuit is designated $V_{th1}$. When an input signal of the Schmitt trigger circuit falls, threshold voltage $V_{th2}$ of the Schmitt trigger is used, and when this input signal rises threshold voltage $V_{th3}$ of the Schmitt trigger is used all of the threshold voltages are set so as to satisfy the following relations.

$$V_{th2} < V_{th1} < V_{th3}$$

Further, it is desirable that the value of $V_{th1}$ be set at an intermediate value level somewhere between $V_{th2}$ and $V_{th3}$.

The Schmitt trigger circuit is constituted as follows: P type MOS transistor Q11 and N type MOS transistors Q12 and Q13 are connected in series between a terminal of power source potential $V_{cc}$ and a terminal of an earth potential $V_{ss}$; gates of transistors Q11, Q12, and Q13 are commonly connected to a Q output terminal; a connecting point of transistors Q11 and Q12 is connected to output terminal $V_{out}$ through inverter I3. Further, a drain and a source of another N type MOS transistor Q14 are mutually connected to a drain and a source of transistor Q12, respectively, a gate of transistor Q14 being controlled by an output of inverter I3, thereby obtaining the desired hysteresis characteristics.

The operation of the semiconductor circuit device will now be described with reference to FIGS. 5A-5F.

Figure 5A:
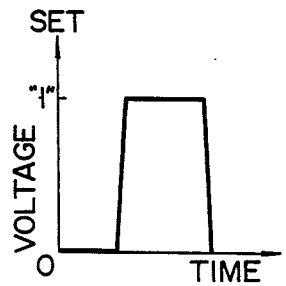
FIGS. 5A to 5F are diagrams to be used in explaining the operation of the semiconductor circuit device shown in FIG. 4.
Figure 5C:
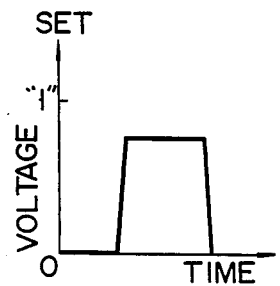
Figure 5E:
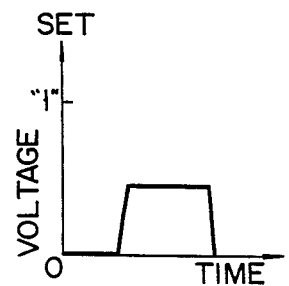
Figure 5B:
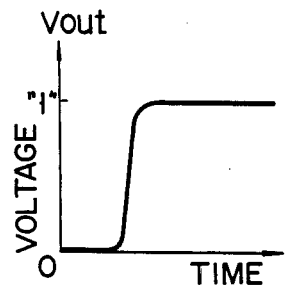
Figure 5D:
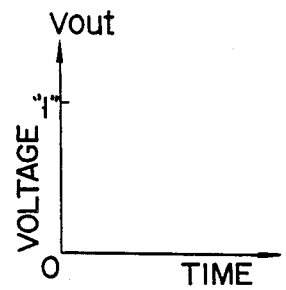
Figure 5F:
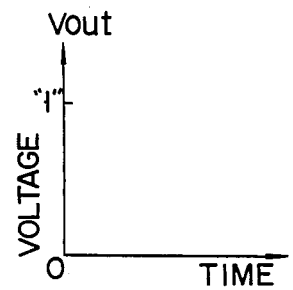

If a set signal of the "1" level as shown in FIG. 5A is supplied to a gate of transistor Q1 when a reset signal is at the "0" level, the potential of the Q output terminal is set to the "1" level, so that output potential $V_{out}$ of the Schmitt trigger circuit is also set to the "1" level as shown in FIG. 5B. On the other hand, in the case where the potential of the set signal is of a lower value than the "1" value level as shown in FIGS. 5C and 5E, the output potential of terminal Q becomes logically unstable for the period of time mentioned above. Even if the potential of the Q output terminal at this time became threshold voltage $V_{th1}$ of the flip-flop circuit, this threshold voltage $V_{th1}$ would still be of a lower value than the threshold voltage $V_{th3}$ of the Schmitt trigger circuit at the leading time of the input signal. Therefore, the Schmitt trigger circuit is not influenced by the unstable output potential of the Q output terminal, and is held at its preceding output level. Namely, the "0" level is maintained as shown in FIGS. 5D and 5F.

On the other hand, if the signal of the level lower than the "1" is supplied as a reset signal when the set signal is at the "0" level, the potential of the Q output terminal will decrease from the "1" level and stop at the threshold value $V_{th1}$ of the flip-flop circuit. However, the threshold voltage $V_{th2}$ of the Schmitt trigger circuit is set so as to be of a lower value than $V_{th1}$, so that when the input signal falls, the output level of the Schmitt trigger circuit remains constant without being influenced by the unstable potential of the input signal.

Therefore, even if the noises were input to the gate of transistor Q1 serving as a set input terminal or to the gate of transistor Q2 serving as a reset input terminal in the semiconductor circuit device such as to make the flip-flop circuit unstable, the output of the Schmitt trigger circuit can be prevented from becoming unstable due to the influence of the noise. A highly reliable output can be obtained.

Figure 1:
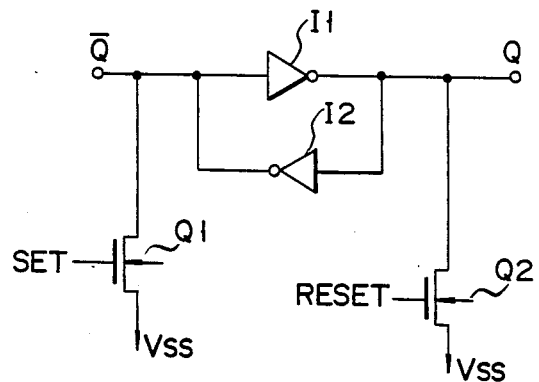
FIG. 1 is a circuit diagram showing a conventional bistable circuit.
Figure 2:
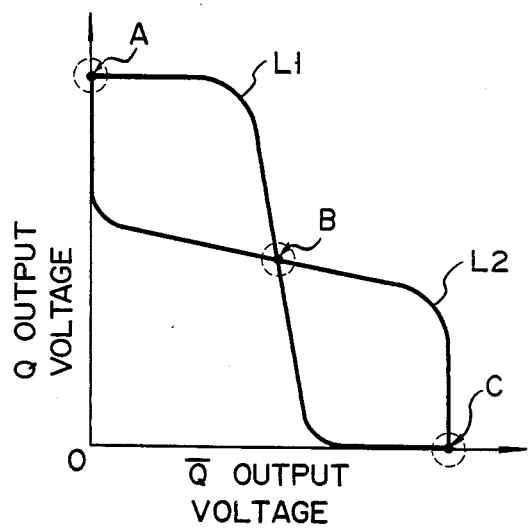
FIG. 2 is a diagram showing the operation characteristics of the bistable circuit shown in FIG. 1.
Figure 3A:
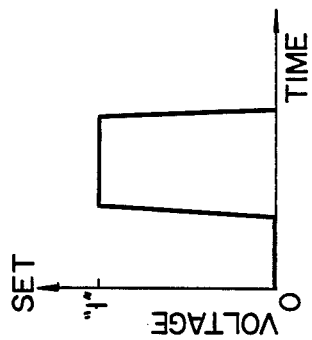
FIGS. 3A to 3F are diagrams showing the input and output characteristics of the bistable circuit shown in FIG. 1.
Figure 3C:
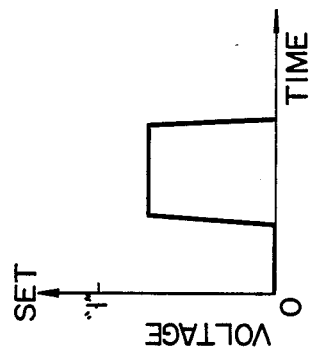
Figure 3E:
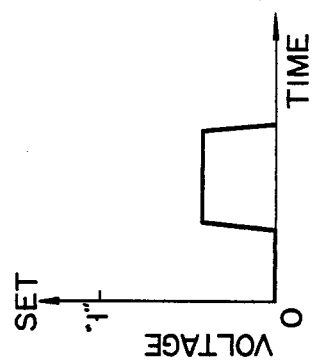
Figure 3B:
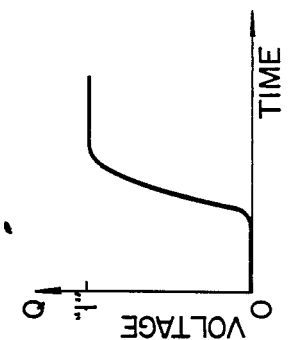
Figure 3D:
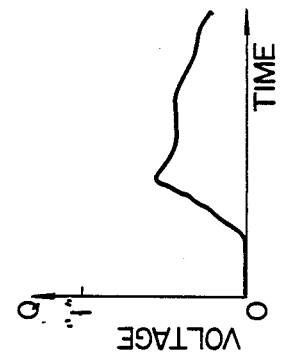
Figure 3F:
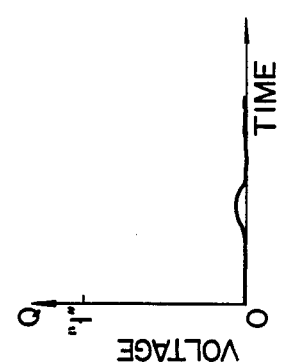

FIGS. 6 and 7 show semiconductor circuit devices according to other embodiments of the invention, respectively. FIG. 6 shows an example of a circuit where the R-S flip-flop circuit is constituted by two NOR gates 11 and 12. FIG. 7 shows an example of a circuit in which the R-S flip-flop circuit is constituted by two NAND gates 13 and 14. Even in these semiconductor circuit devices, an effect similar to that in the device of FIG. 1 can be obtained by setting threshold voltage $V_{th1}$ of the flip-flop circuit, threshold voltage $V_{th2}$ when the input signal of the Schmitt trigger circuit falls, and threshold voltage $V_{th3}$ when this input signal rises, so as to satisfy the following relation:

$$V_{th2} < V_{th1} < V_{th3}$$

FIG. 8 shows another example of a Schmitt trigger circuit. This Schmitt trigger circuit is constituted in the following manner: P type MOS transistor Q22 is inserted as a load between a terminal of power source potential $V_{cc}$ and output terminal T2; N type MOS transistors Q23 and Q24, whose gates are commonly connected to input terminal T1, are connected in a series between output terminal T2 and a terminal of earth potential $V_{ss}$. The potential at the series connecting point is changed by N type MOS transistor Q25 whose conduction is controlled by the potential of output terminal T2, thereby obtaining the desired hysteresis characteristics.

If the foregoing relation among the three threshold voltages is satisfied and the Schmitt trigger circuit with the above constitution is used, a similar effect can be derived.

Although the foregoing embodiments have only described the case in which the R-S flip-flop circuit was used, the invention can be also applied to a circuit such as J-K flip-flop, T flip-flop, or the like.

What is claimed is:

1. A semiconductor circuit device comprising:
    a bistable circuit having a threshold voltage of a first value, said bistable circuit providing an output potential responsive to an input signal; and
    a Schmitt trigger circuit having a second threshold voltage of a lower valve than said first value and a third threshold voltage of a higher valve than said first valve, said Schmitt trigger circuit also having an input terminal operatively coupled to receive the output potential from said bistable circuit, said Schmitt trigger circuit outputting a first logic level when the output potential rises higher than the third threshold voltage and outputting a second logic level when the output potential falls lower than the second threshold voltage.

2. A device according to claim 1, wherein said bistable circuit is an R-S flip-flop circuit having a set signal input terminal and a reset signal input terminal.

3. A device according to claim 2, wherein said flip-flop circuit comprises first and second inverters connected in parallel such that an output of said first inverter is connected to an input of said second inverter.

4. A device according to claim 2, wherein said flip-flop circuit comprises first and second NOR gates each having an input connected to the set or reset terminals, respectively.

5. A device according to claim 2, wherein said flip-flop circuit comprises first and second NAND gates each having an input connected to the set and reset terminals, respectively.

* * * * *